United States Patent
Kanou et al.

(10) Patent No.: US 12,101,074 B2
(45) Date of Patent: Sep. 24, 2024

(54) MULTILAYER CIRCUIT BOARD WITH LC RESONANT CIRCUIT AND ELECTRONIC COMPONENT PACKAGE INCLUDING MULTILAYER CIRCUIT BOARD WITH LC RESONANT CIRCUIT

(71) Applicant: TOPPAN INC., Tokyo (JP)

(72) Inventors: Noriko Kanou, Tokyo (JP); Susumu Maniwa, Tokyo (JP)

(73) Assignee: TOPPAN INC., Tokyo (JP)

( * ) Notice: Subject to any disclaimer, the term of this patent is extended or adjusted under 35 U.S.C. 154(b) by 359 days.

(21) Appl. No.: 17/551,385

(22) Filed: Dec. 15, 2021

(65) Prior Publication Data

US 2022/0109416 A1    Apr. 7, 2022

Related U.S. Application Data

(63) Continuation of application No. PCT/JP2020/022662, filed on Jun. 9, 2020.

(30) Foreign Application Priority Data

Jun. 18, 2019  (JP) ................................. 2019-112890

(51) Int. Cl.
  *H03H 7/01*   (2006.01)
  *H05K 1/11*   (2006.01)
  *H05K 1/16*   (2006.01)

(52) U.S. Cl.
  CPC ........ *H03H 7/1741* (2013.01); *H03H 7/0115* (2013.01); *H05K 1/115* (2013.01); *H05K 1/16* (2013.01)

(58) Field of Classification Search
  None
  See application file for complete search history.

(56) References Cited

U.S. PATENT DOCUMENTS

| 7,967,216 B2 * | 6/2011 | Kato | ........................ H01Q 1/38 235/492 |
| 2017/0187345 A1 | 6/2017 | Yun et al. | |

FOREIGN PATENT DOCUMENTS

| JP | 8-250962 A | 9/1996 |
| JP | 2018-99705 A | 6/2018 |

(Continued)

OTHER PUBLICATIONS

JP 2019/083282 A Translation (Year: 2024).*

(Continued)

*Primary Examiner* — Hoa C Nguyen
*Assistant Examiner* — John B Freal
(74) *Attorney, Agent, or Firm* — Foley & Lardner LLP

(57) ABSTRACT

A multilayer circuit board with an LC resonant circuit that has an electronic component package including the multilayer circuit board with the LC resonant circuit are provided. The multilayer circuit board with the LC resonant circuit configured by alternately laminating conductive layers and insulating resin layers on both sides of a core substrate includes a first set of wiring lines, a set of vias, and a second set of wiring lines. The first set of wiring lines configures both ends of the LC resonant circuit and is formed in a first one of the conductive layers. The set of vias extends through the insulating resin layers. The second set of wiring lines is connected to an input/output terminal of the LC resonant circuit and is formed in a second one of the conductive layers. The first set of wiring lines is connected to the second set of wiring lines.

9 Claims, 11 Drawing Sheets

(56) References Cited

FOREIGN PATENT DOCUMENTS

| JP | 2019-507972 A | | 3/2019 |
|---|---|---|---|
| JP | 2019-83282 A | | 5/2019 |
| JP | 2019083282 A | * | 5/2019 |

OTHER PUBLICATIONS

Extended European Search Report issued in corresponding European Patent Application No. 20827910.9 dated Jul. 12, 2022.
Lee, T.C., et al., "Glass Based 3D-IPD Integrated RF ASIC in WLCSP," IEEE Electronic Components and Technology Conference, 631-636 (2017).
Onohara, J., et al., "Development of the Integrated Passive Device using Through-Glass-Via substrate," International Conference on Electronics Packaging and IMAPS, 19-22 (2018).
Tanaka, M et al., "Design demonstration of band-pass-filter characteristics with integrated passive device on glass interposer," International Conference on Electronics Packaging, 311-315 (2019).
International Searching Authority, "International Search Report," issued in connection with International Patent Application No. PCT/JP2020/022662, dated Aug. 11, 2020, 5 pages.
International Searching Authority, "Written Opinion," issued in connection with International Patent Application No. PCT/JP2020/022662, dated Aug. 11, 2020, 4 pages.

* cited by examiner

FIG.1-a
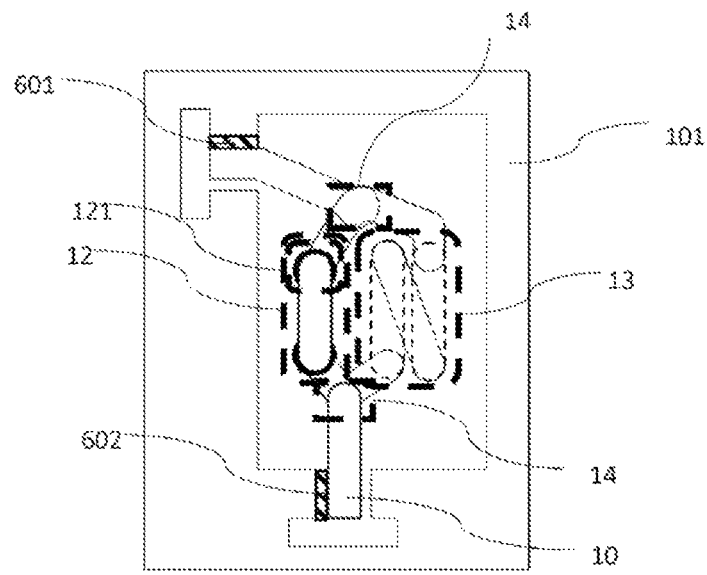
FIG.1-b
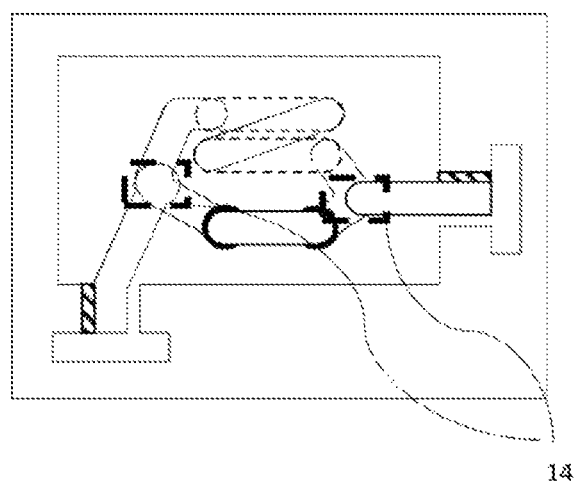
FIG.2
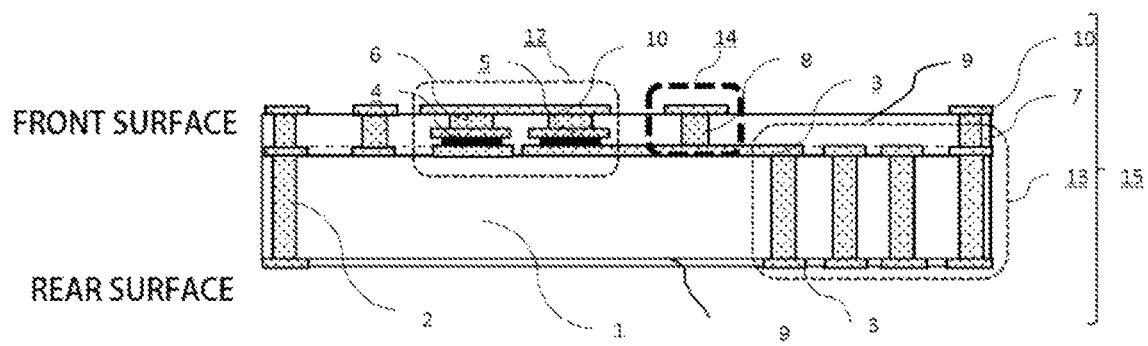

FIG.3-a
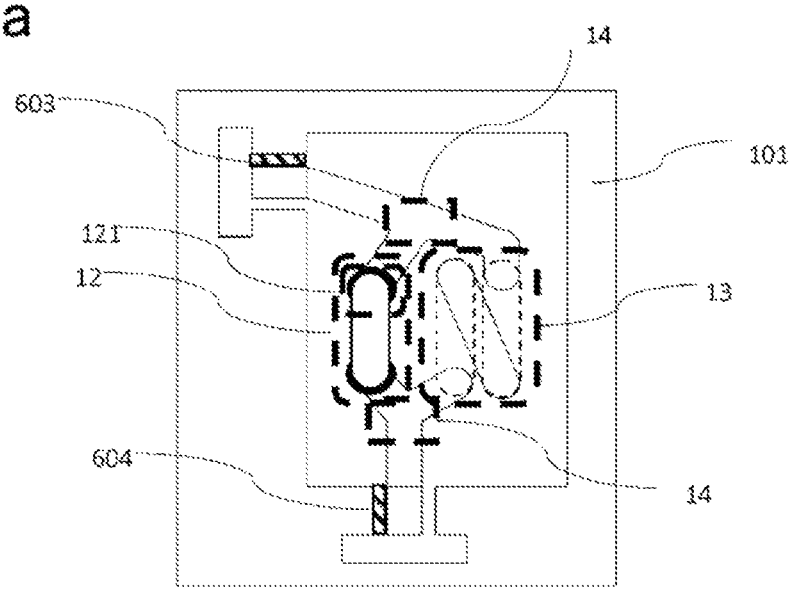
FIG.3-b
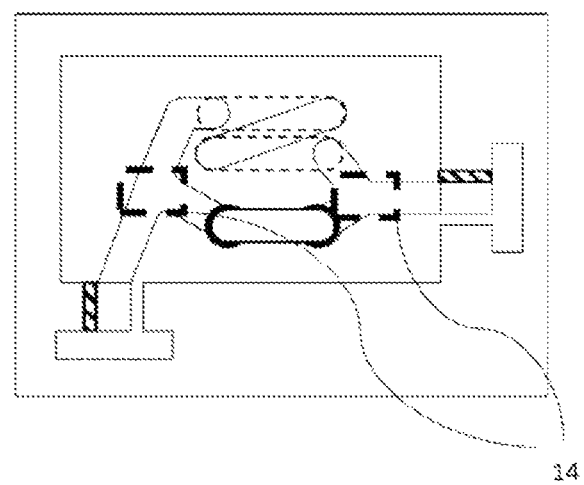
FIG.4
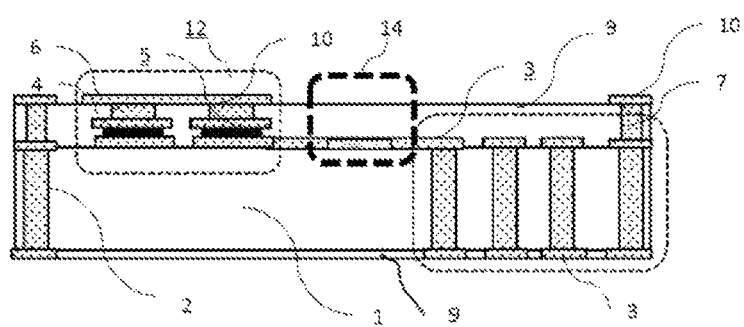

FIG.22
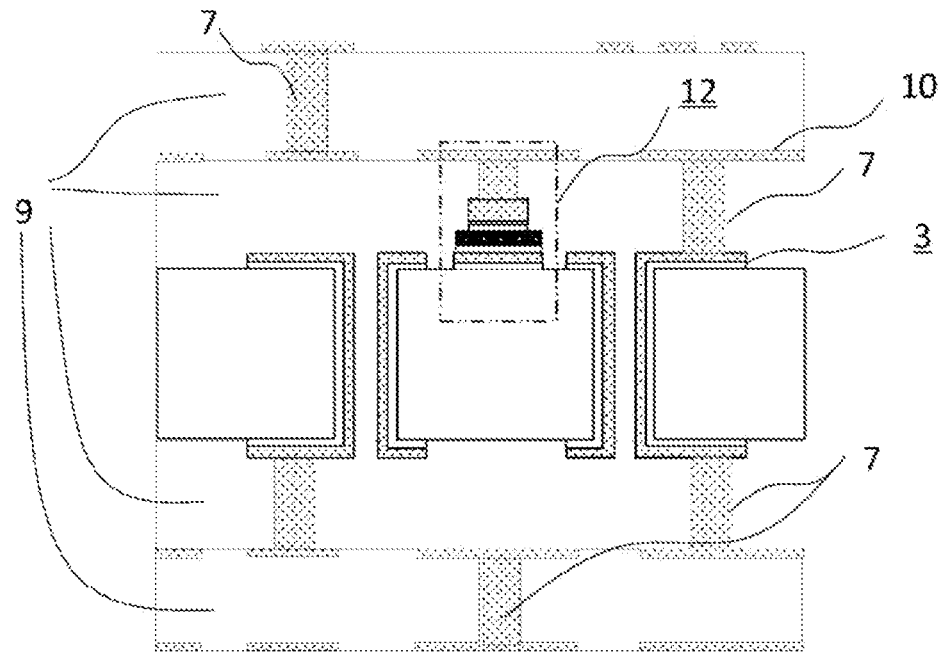
FIG.23-a
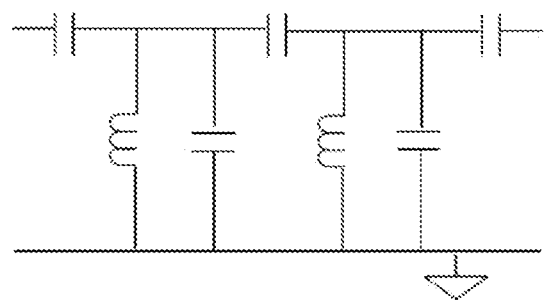
FIG.23-b
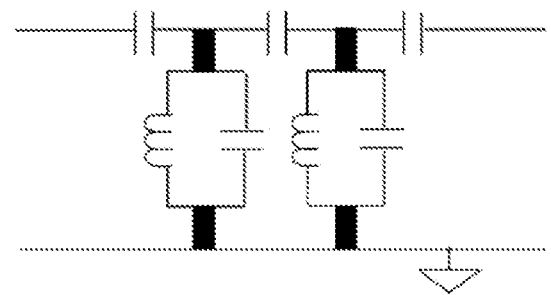

FIG.24-a
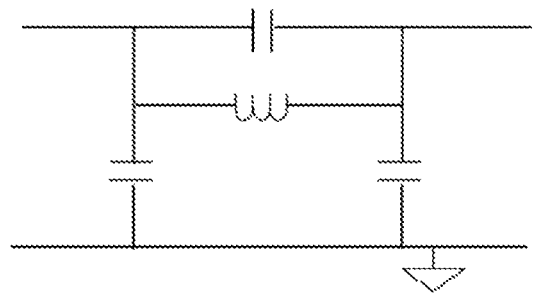
FIG.24-b
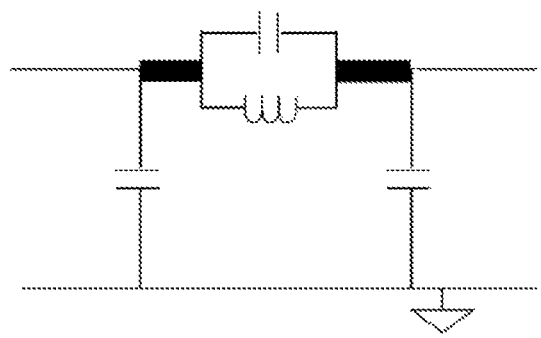
FIG.25-a
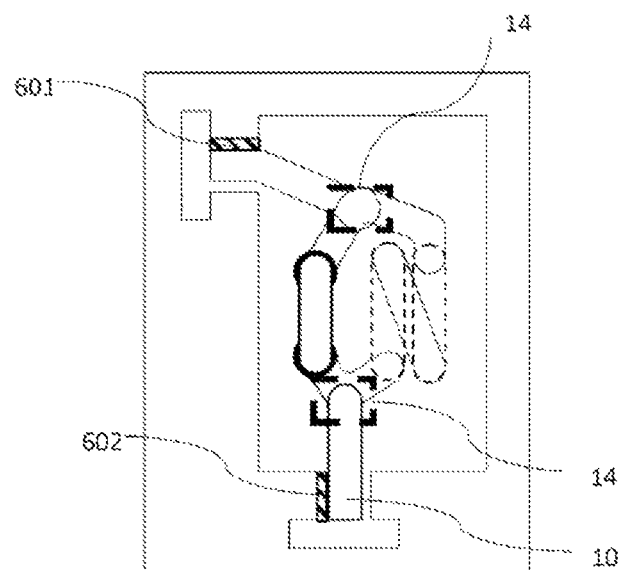

FIG.25-b
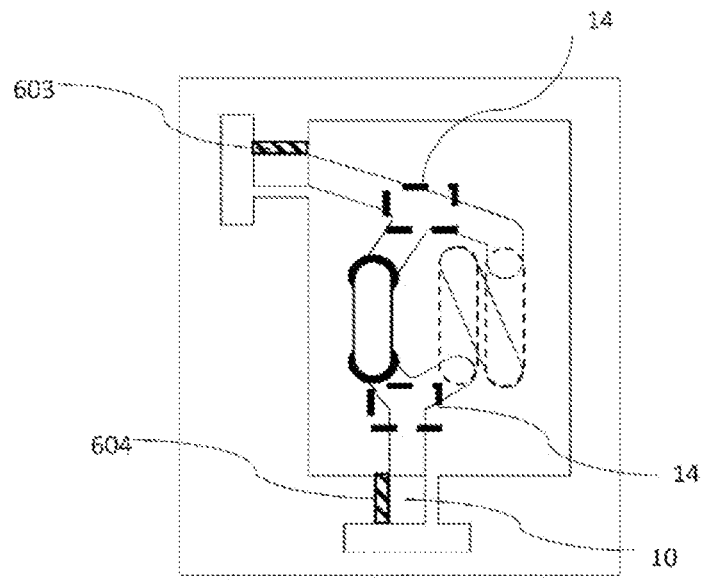
FIG.26
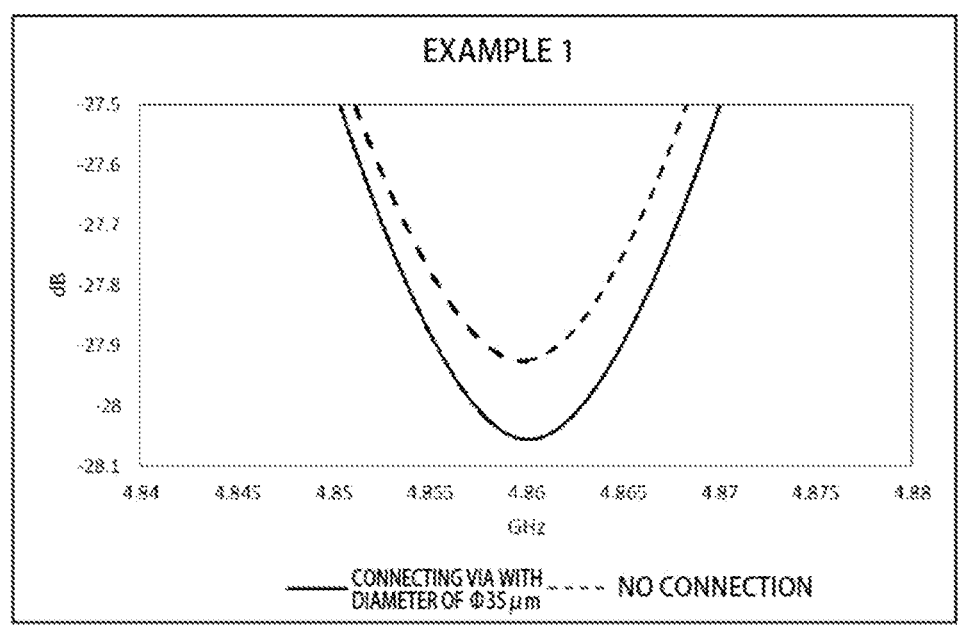

MULTILAYER CIRCUIT BOARD WITH LC RESONANT CIRCUIT AND ELECTRONIC COMPONENT PACKAGE INCLUDING MULTILAYER CIRCUIT BOARD WITH LC RESONANT CIRCUIT

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/022662, filed on Jun. 9, 2020, which is based upon and claims the benefit of priority to Japanese Patent Application No. 2019-112890, filed on Jun. 18, 2019; the disclosures of which are incorporated herein by reference in their entireties.

TECHNICAL FIELD

The present invention relates to a multilayer circuit board with an LC resonant circuit and an electronic component package including the multilayer circuit board with the LC resonant circuit.

BACKGROUND

As the performance of mobile devices has improved, electronic components in the mobile devices have achieved high density and miniaturization. In view of increasing the performance, adjacent frequencies in a plurality of bands ranging from MHz to GHz are used, and higher frequencies are to be used for high-speed and high-capacity data communication. Given these circumstances, signal processing is conducted in a device through a switching element by filtering signals in a high-frequency front end module and dividing them into blocks. The field of mobile devices requires an appropriate filter that accurately acquires the frequency band to be used and has the characteristics of blocking the frequency in adjacent bands.

Methods of transmission and reception of mobile devices are broadly classified into FDD systems and TDD systems, which may be used in combination in recent front-end modules. Equipment that uses FDD system uses a surface-mount filter, such as a BAW filter and a SAW filter, that has steep attenuation characteristics and selects a narrow band of 20 to 100 MHz. TDD system requires a filter that has a passband of 500 to 900 MHz. It is considered difficult for BAW filter and SAW filter to cover a relatively wide band of 400 MHz to 900 MHz required for TDD system at sub-6 GHz (3.7/4.5 GHz) or higher. An example of a component that has characteristics of filtering a wide frequency band includes LTCC filter, but the stopband attenuation characteristics are relatively gentle. A filter that has steeper attenuation characteristics and can reliably block the adjacent bands is desired.

In the above-described front-end module, a large number of passive components including filters, and a large number of active components are mounted on a front-end module substrate. It is expected that the number of these components will increase in the future in order to perform high-speed and large-capacity communication using various frequency bands. Accordingly, it has been proposed to reduce the number of components on the substrate surface by embedding passive components, which include inductors and capacitors, filters, and the like inside the circuit board in order to contribute to the reduction of size and profile. Embedding the elements in the substrate makes it possible to reduce the wiring length and also reduces reflection at joints with dissimilar members such as solder. This is advantageous for a substrate that deals with high frequencies.

As a method for embedding a capacitor, which is a passive component, inside the substrate, in addition to a method of burying the capacitor component inside the substrate, there has been proposed a method of laminating a capacitor using a thin-film technique inside a multilayer circuit board taking advantage of the structure of conductive layers and insulating resins laminated in the multilayer circuit board.

Due to advances in through-hole forming technique in recent years, small-diameter through-holes having a diameter of 100 µm or less at a pitch of 150 µm or less can be accurately formed, for example, in a glass material having a thickness of 300 µm. After forming through holes in a glass substrate using this technique, conductive layers on the front and rear of the glass substrate are electrically connected through energization process, so that elements having the shape of minute solenoid inductors is formed. Because the center of the magnetic flux of these elements is generated horizontally to the planar direction of the glass, the elements are unlikely to affect the surroundings in terms of the electromagnetic field and are unlikely to be affected by the surroundings in terms of the electromagnetic field.

Further, glass substrates are excellent in flatness and smoothness, have properties similar to silicon substrates in the formation of fine wiring, and can provide high insulation properties in electrical characteristics. Because formation of a thin film having a thickness of 200 nm or less is possible, taking advantage of the flatness and smoothness, glass is a material that is also superior in forming a capacitor structure having a minute and high capacity. These characteristics are attracting attention for use in semiconductor interposers and high-frequency fields. Formation of capacitor structures and inductor structures in the glass substrate can be applied as a technique for obtaining a high-frequency front end module substrate that is reduced in size and profile. PTL 1 discloses such a technique to obtain a frequency filter by combining the inductor structure and the capacitor structure.

CITATION LIST

[Patent Literature] PTL 1: Japanese Patent Application No. 2018-99705.

SUMMARY OF THE INVENTION

Technical Problem

Many of the wiring connections of the inductor and the capacitor formed in the glass substrate disclosed in PTL 1 share the wiring itself with part of a resonator to efficiently reduce the wiring length. Thus, a phenomenon occurs in which the current that flows through an LC parallel resonator at a resonant frequency also flows through a main signal line (also referred to as the main line). Since the path through which a resonant current flows is mixed with part of the main line, the filter characteristics deteriorate. When a plurality of resonators are connected, the signal degradation is accumulated.

In view of the above problem, the present invention aims at providing a multilayer circuit board with an LC resonant circuit having enhanced resonance characteristics and signal attenuation characteristics, and an electronic component package including the multilayer circuit board with the LC resonant circuit.

Solution to Problem

To solve the above problem, a representative multilayer circuit board with an LC resonant circuit according to the present invention separates a path through which a resonant current flows by an interlayer via formed between layers in a resonant circuit constituted by a capacitor and an inductor, so that a path through which a high-frequency current near a resonant frequency flows is separated.

Advantageous Effects of the Invention

The present invention provides a multilayer circuit board with an LC resonant circuit having enhanced resonance characteristics and signal attenuation characteristics, and an electronic component package including the multilayer circuit board with the LC resonant circuit.

Problems, configurations, and advantageous effects which are other than noted above will become apparent from the following description of embodiments.

BRIEF DESCRIPTION OF THE DRAWINGS

FIG. 1-a is a detailed top view of a parallel resonant circuit (main line to GND) including a connecting via 8 according to an embodiment of the present invention.

FIG. 1-b is a top view of a parallel resonant circuit including the connecting via 8 according to an embodiment of the present invention.

FIG. 2 is a cross-sectional view of a multilayer circuit board including the connecting via 8 according to an embodiment of the present invention.

FIG. 3-a is a detailed top view of a conventional parallel resonant circuit.

FIG. 3-b is a top view of the conventional parallel resonant circuit.

FIG. 4 is a cross-sectional view of a conventional multilayer circuit board.

FIG. 22 is a cross-sectional view showing a step of forming the multilayer circuit board according to the embodiment of the present invention.

FIG. 23-a is an equivalent circuit diagram of a two-pole bandpass filter.

FIG. 23-b is an equivalent circuit diagram of a two-pole bandpass filter.

FIG. 24-a is an equivalent circuit diagram of a low-pass filter including an attenuation pole.

FIG. 24-b is an equivalent circuit diagram of a low-pass filter including an attenuation pole.

FIG. 25-a is a top view of a parallel resonant circuit including the connecting via 8 according to an example of the present invention.

FIG. 25-b is a top view of a conventional parallel resonant circuit.

FIG. 26 is a graph showing transmission characteristics at a resonant frequency.

DETAILED DESCRIPTION

Figure 5:
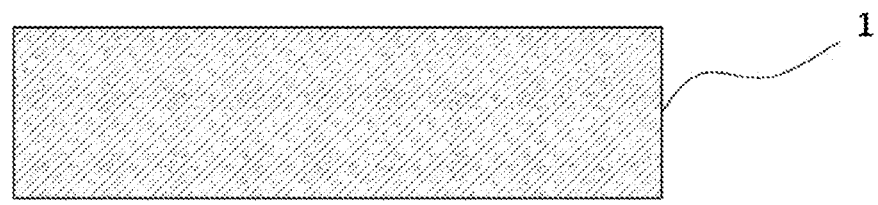
FIG. 5 is a cross-sectional view showing a manufacturing step of the multilayer circuit board including the connecting via 8 according to an embodiment of the present invention.

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

A two-pole bandpass filter that includes resonators as shown in FIG. 23-a includes at least two LC parallel resonators. In this circuit, the impedance of the parallel resonators near a resonant frequency is high, and a current flow to a GND line is rapidly decreased. Thus, the main line has the characteristics of a bandpass filter.

To increase the attenuation characteristics of the parallel resonators at a given frequency, it is effective to have a higher impedance at the resonant frequency. The phase differences between the current and the voltage for a capacitor and a coil are 90 degrees and −90 degrees. Thus, when a parallel connection is employed, for example, a difference of 180 degrees occurs at a connecting point, which establishes an open state for high frequencies. Using this fact, in the embodiments of the present invention, a connection method is employed that separates the resonators from the main line as shown in FIG. 23-b.

FIGS. 1-a to 4 are top views and cross-sectional views of the simplest LC parallel resonant circuit given as an example of an LC resonant circuit. FIGS. 1-a and 1-b are top views of the LC parallel resonant circuit according to an embodiment of the present invention. FIGS. 3-a and 3-b are top views of the LC parallel resonant circuit in which a path of a resonant current is not separated. The sizes of the elements are the same in both circuits and connecting portions differ.

FIG. 2 is a cross-sectional view of the LC parallel resonant circuit according to an embodiment of the present invention. The wiring that is formed on a lower conductive layer 3 and connects an inductor and a capacitor, which constitute a resonator, is connected to the wiring that is formed on an upper conductive layer 10 and is connected to an input/output terminal using a connecting via 8. FIG. 4 is a cross-sectional view of the LC parallel resonant circuit in which the path of the resonant current is not separated. The wiring to be connected to the input/output terminal branches from the wiring that is formed on the lower conductive layer 3 and connects the inductor and the capacitor, which constitute the resonator.

A multilayer circuit board 15 according to the present embodiment includes an inductor structure 13 in a substrate and a capacitor structure 12 on a laminate surface. This acts as an electronic component with an LC resonant circuit that is used in wireless communication such as in mobile devices.

The multilayer circuit board 15 includes a glass substrate as a core substrate 1. The core substrate 1 includes through holes 2 in a lamination direction. When the top surface in the cross-section of the core substrate 1 is referred to as a front surface, and the bottom surface is referred to as a rear surface, conductive layers and insulating resin layers are alternately laminated on each of the front and rear surfaces. The through holes 2 are formed in the core substrate 1 as portions that electrically connect adjacent conductive layers. An upper electrode via 6 of the capacitor, an interlayer via 7, and the connecting via 8 are formed in an insulating resin layer 9.

Figure 6:
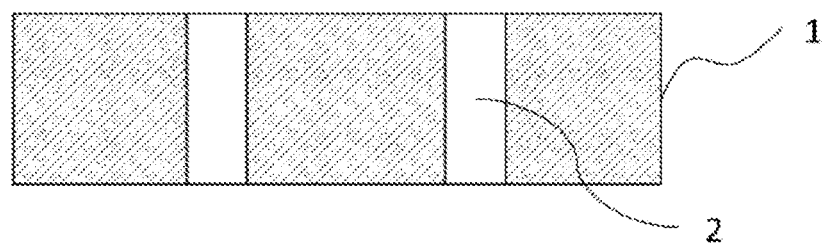
FIG. 6 is a cross-sectional view showing a manufacturing step of the multilayer circuit board including the connecting via 8 according to the embodiment of the present invention.
Figure 7:
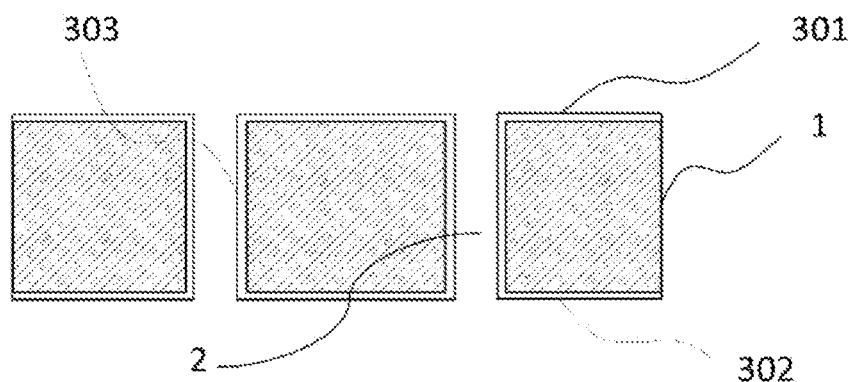
FIG. 7 is a cross-sectional view showing a manufacturing step of the multilayer circuit board including the connecting via 8 according to the embodiment of the present invention.

Next, steps for manufacturing the multilayer circuit board will be described using cross-sectional views of FIGS. 5 to 13. The glass core substrate 1 of FIG. 5 is provided with the through holes 2 as shown in FIG. 6. The inner wall of the through holes 2 is provided with a plating seed layer 303 as shown in FIG. 7. The plating seed layer is also formed on front and rear surfaces 301 and 302 of the glass substrate.

Figure 8:
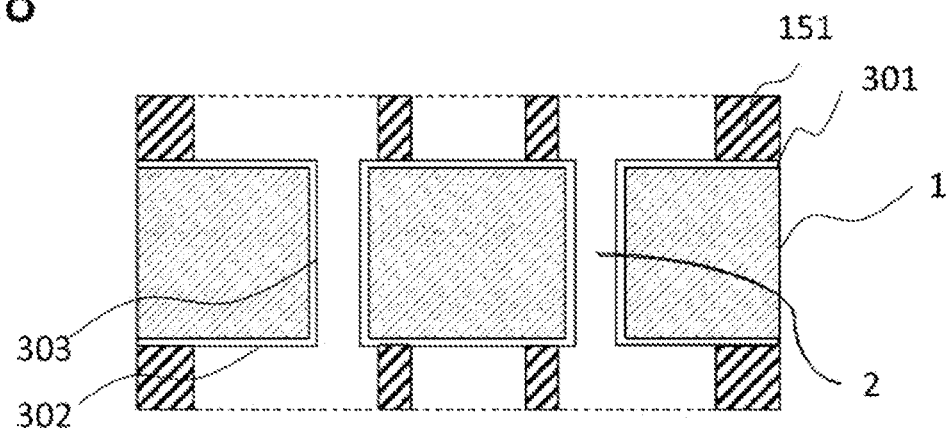
FIG. 8 is a cross-sectional view showing a manufacturing step of the multilayer circuit board including the connecting via 8 according to the embodiment of the present invention.
Figure 9:
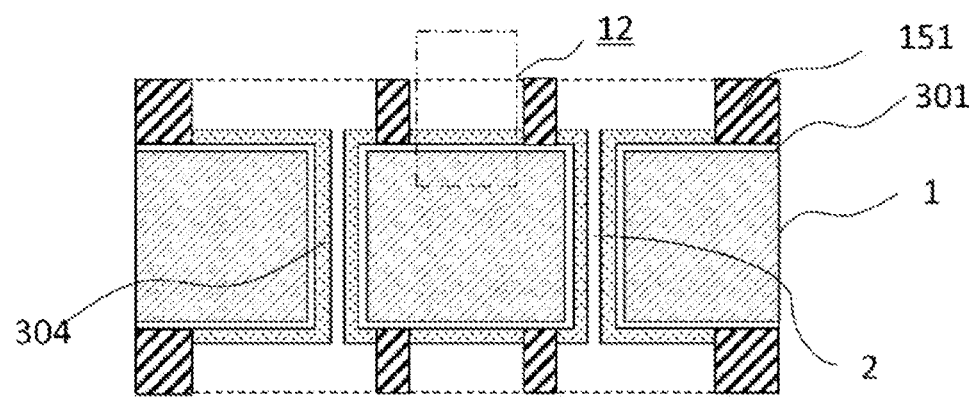
FIG. 9 is a cross-sectional view showing a manufacturing step of the multilayer circuit board including the connecting via 8 according to the embodiment of the present invention.

In FIG. 8, a resist 151 is used to form openings for forming a plating pattern at predetermined positions. In FIG. 9, copper plating 304 is provided through the openings of FIG. 8 so that the film thickness on the front and rear surfaces of the glass is uniform. A place to form the capacitor structure 12 is provided at a predetermined position. Apart from this, the through holes 2 are used to provide a wiring pattern by plating to wind around the core substrate 1, so that the solenoid inductor structure 13 is formed.

Figure 10:
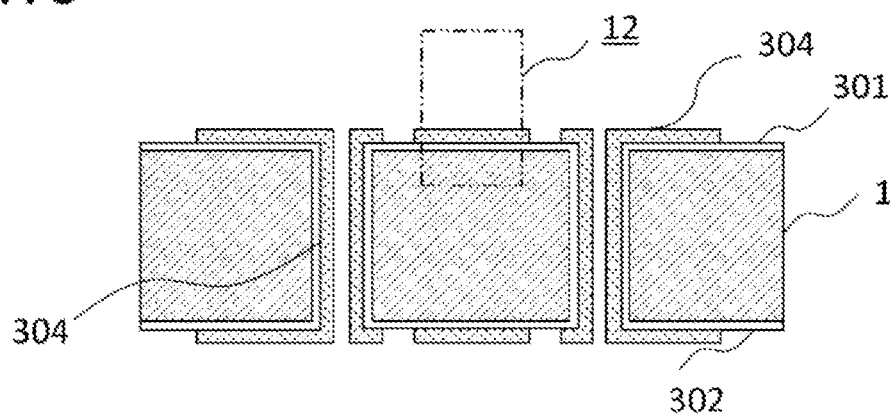
FIG. 10 is a cross-sectional view showing a manufacturing step of the multilayer circuit board including the connecting via 8 according to the embodiment of the present invention.

In FIG. 10, the resist 151 is removed leaving the wiring pattern of the plating seed layer and the lower conductive layer 3. Subsequently, in FIG. 11, the plating seed layers 301 and 302 formed on unwanted portions are removed to form insulating resin layers 901 to 903.

Figure 12:
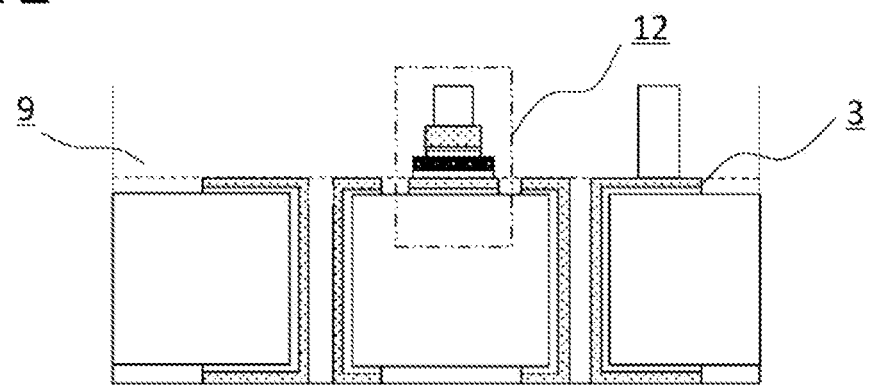
FIG. 12 is a cross-sectional view showing a manufacturing step of the multilayer circuit board including the connecting via 8 according to the embodiment of the present invention.

In FIG. 12, the insulating resin layer 9 is laminated, and a metal-insulator-metal (MIM) capacitor is formed inside the insulating resin layer 9. The MIM capacitor is further provided with the upper electrode via 6 of the capacitor for connecting to the upper conductive layer 10. Further, the interlayer via 7 for connecting the wiring pattern formed on the lower conductive layer 3 to the upper conductive layer 10, or the connecting via 8 according to the embodiment of the present invention is formed.

Figure 13:
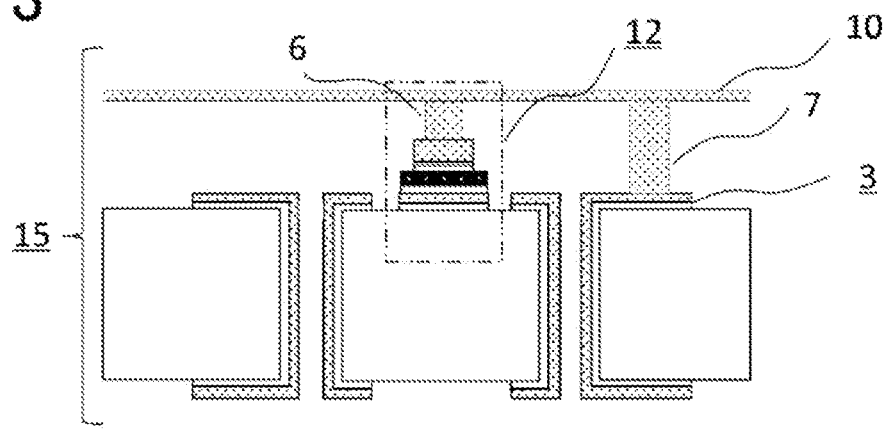
FIG. 13 is a cross-sectional view showing a manufacturing step of the multilayer circuit board including the connecting via 8 according to the embodiment of the present invention.

In FIG. 13, the upper conductive layer 10 is formed on the insulating resin. The multilayer circuit board 15 is formed by laminating any number of layers in this manner.

The individual elements will now be described in terms of materials, shapes, physical properties, and preferred performance.

The core substrate 1 may be, but is not limited to be, made of glass, ceramics, organic resins, semiconductors, or a composite material thereof as long as the resonant circuit including the inductor structure 13 and the capacitor structure 12 is formed in the substrate.

The core substrate 1 needs to be superior in the dimensional stability. The coefficient of linear expansion is desirably −0.5 ppm/K or more and 15.0 ppm/K or less. Since the multilayer circuit board of the present embodiment can also be used for mounting semiconductor components, the core substrate 1 preferably has a coefficient of linear expansion equivalent to that of a silicon chip, which is approximately 4 ppm/K.

Furthermore, the core substrate 1 needs to be formed of a material with low hygroscopicity. This is because if the inside of the core substrate 1 absorbs moisture, outgassing occurs, which lowers the reliability of the interlayer connection in the substrate.

Glass substrates are inexpensive, have excellent surface flatness and insulation properties, and are suitable for forming high-frequency circuits. The glass may be, for example, non-alkali glass, alkali glass, borosilicate glass, quartz glass, sapphire glass, photosensitive glass, or the like.

In the present embodiment, non-alkali glass is used in view of the high-frequency application. The method for forming the core substrate 1 using the glass that is used in the present embodiment may be any method and not limited to a specific method. Functions such as imparting strength and antistatic properties may be imparted by surface treatment or the like.

The thickness of the core substrate 1 is preferably 0.08 mm or more and 0.8 mm or less in view of the process for forming the through holes 2 and the handling during manufacture. In terms of handling of the core substrate 1, the multilayer circuit board 15 of the present invention may be manufactured with the core substrate 1 adhered to a support substrate. The material of the support substrate is not limited to a specific material.

Subsequently, the through holes 2 of the core substrate 1 in FIG. 6 are formed by a laser, chemical treatment, electrical discharge machining, or a method combining any of these. As shown in FIG. 7, the plating seed layer 303 is formed on the wall by, for example, sputtering. Chemical treatment to smoothen the wall may be performed after forming the through holes 2.

As the method of forming the through holes 2, besides laser processing or electrical discharge machining, if a photosensitive resist material is used, sandblasting, dry etching, or chemical etching using hydrofluoric acid or the like may be used in this step. Laser processing or electric discharge machining is desirable because of ease and high throughput. Note that the laser that can be used may be selected from a CO2 laser, a UV laser, a picosecond laser, and a femtosecond laser. From a structural viewpoint, the opening diameter is preferably smaller than the width of the wiring formed in the lower conductive layer 3, which is formed on the front and rear of the core substrate 1. More preferably, due to the processing accuracy in hole formation and the accuracy in photolithography, an opening having a diameter smaller than the end of the wiring by 10 μm or more is desirably located at a connecting portion with the wiring on the lower conductive layer 3.

In FIG. 7, the plating seed layers 301, 302, and 303 serve as a power supply layer and an adhesive layer for electroplating performed during the formation of the wiring pattern through a semi-additive process.

The plating seed layers are formed on the front and rear surfaces 301 and 302 of the glass and on the inner wall 303 of the through holes 2 by sputtering or chemical vapor deposition (CVD).

For example, copper, nickel, titanium, aluminum, chromium, molybdenum, tungsten, tantalum, gold, palladium, iridium, ruthenium, platinum, or a combination thereof may be used. Furthermore, electroless copper plating or electroless nickel plating is performed on the plating seed layer.

The plating seed layers 301, 302, and 303 shown in FIG. 7 are preferably formed by sputtering a copper layer on a titanium layer in view of the electrical characteristics, ease of manufacture, and costs. For the adhesion of the plating seed layers on the glass substrate, the film thickness is desirably 1 μm or less in forming fine wiring through the semi-additive process.

In FIG. 8, after forming the plating seed layers 301, 302, and 303, the photoresist pattern 151 is formed. As an example of the method for forming the photoresist pattern 151, the photoresist to be formed can be made of a negative dry film resist, a negative liquid resist, or a positive liquid resist. In the present embodiment, a negative dry film resist was used. Roll lamination or vacuum lamination can be used for the negative dry film resist. If a liquid type is used, slit coating, curtain coating, die coating, spray coating, electrostatic coating inkjet, gravure coating, screen coating, or the like can be used. Methods for forming the photoresist other than the above can be used.

In FIG. 9, the resist pattern 151 is formed so that portions where the conductive layers are to be formed are exposed on the photoresist layer using a typical photolithography technique. The resist layer 151 desirably has a thickness of 5 μm or more and 25 μm or less depending on the thickness of the conductive layer.

The electroless plating layers 301 to 303 of FIG. 7 may be formed by electroless copper plating, electroless nickel plating, or the like. However, due to good adhesion with a glass material or a titanium layer and copper, electroless nickel plating is preferable. An excessively thick electroless nickel plating not only hinders the formation of fine wiring but also leads to a decrease in the adhesion due to film stress and an increase in the electrical resistance. Any material may be used as long as the resistance loss is small, and good adhesion with the core substrate is achieved.

In addition to the sputtering process, the method of performing energization process to the through holes 2 include a method of generating a primer film as a catalyst that increases the adhesion to the glass so as to increase the wettability in the holes, followed by wet deposition of copper on the wall.

Subsequently, in FIG. 9, an energization process is performed to further thicken the wall of the through holes 2 of the present embodiment to form the copper plating layer 304. The copper material preferably has a thickness of 3 μm or more from the wall toward the center of the hole. The thickness is more preferably 6 μm or more because the influence of the skin effect becomes significant, and the signal attenuation amount becomes significant when a high frequency of 2 GHz or higher is used. The energization process to the through holes 2 may be performed by filled plating for filling the through holes 2 with a conductive material or by conformal plating. The method of energization process may be, but is not limited to, sputtering, electroless plating, electroplating, filling, use of a surface treatment chemical solution, printing, coating, or a combination thereof.

In FIG. 9, the lower conductive layer 3 on the front and rear of the core substrate may be formed of a metallic material such as nickel, chromium, palladium, gold, and titanium. The conductive layer is formed by, for example, copper electroplating. In addition to copper electroplating, nickel electroplating, chromium electroplating, palladium electroplating, gold electroplating, or the like may be used. The wiring constituting the wiring pattern may be typically made of copper, but may be made of other metallic materials such as nickel, chromium, palladium, gold, or titanium. The thickness of the conductive layer deposited by copper electroplating is desirably 3 μm or more and 30 μm or less.

In FIG. 10, the photoresist 151 is removed, leaving the wiring pattern 304 and the plating seed layer 301. This exposes the plating seed layers 301 and 302, which were located directly below the resist pattern 151 and are on the front and rear surfaces of the glass. The method for removing the resist is not limited here, but an alkaline aqueous solution is generally used to remove the resist.

Figure 11:
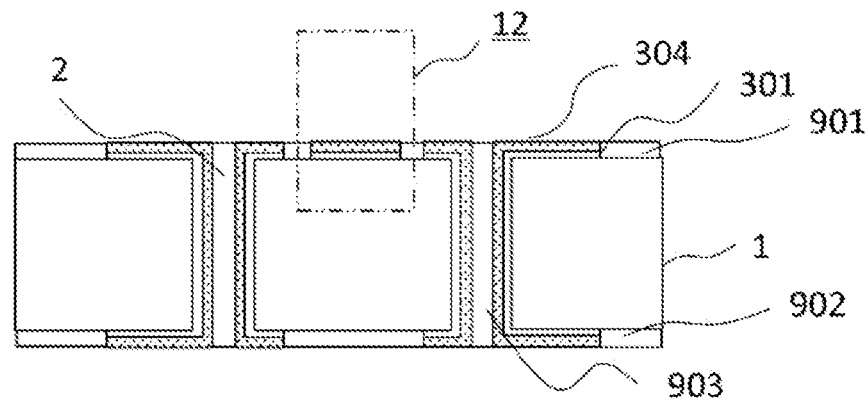
FIG. 11 is a cross-sectional view showing a manufacturing step of the multilayer circuit board including the connecting via 8 according to the embodiment of the present invention.

In FIG. 11, the plating seed layers 301 and 302, which are the exposed portions formed on the front and rear of the core substrate 1, are removed to form the wiring pattern on the lower conductive layer 3. To remove the plating seed layers, chemical etching is sequentially performed on electroless nickel, copper, and titanium. The method and the type of chemical solution for removing the plating seed layers are not limited.

FIG. 12 shows the state in which the capacitor structure 12 is formed in the insulating resin layer 9. The method for forming the metal-insulator-metal (MIM) capacitor of the present embodiment will be described in detail below.

Upon formation of an opening above the capacitor structure 12, the opening extends through the insulating resin layer 9 and reaches the lower conductive layer 3. When the insulating resin is a non-photosensitive resin, the opening is formed using a laser. Note that the laser that can be used may be selected from a CO2 laser, a UV laser, a picosecond laser, and a femtosecond laser. Preferably, a laser may be a UV laser or a CO2 laser. When the insulating resin layer 9 in FIG. 12 is a photosensitive resin, the opening can be formed using photolithography. After forming the via openings, roughening of the resin surface and cleaning the inside of the opening formed in the resin are performed by desmearing using a permanganate solution as appropriate. This improves the adhesion to the metallic layer used in the energization process. Alternatively, cleaning of the resin surface and the inside of the opening may be performed by plasma treatment.

In FIG. 13, the process of providing electrical conduction is performed on the opening formed in the insulating resin layer 9 in FIG. 12. The insulating resin layer 9, the opening, and the upper conductive layer 10 are formed by a known semi-additive process and subtractive process. Laminates may be formed on the upper conductive layer 10 by repeating the above.

The MIM capacitor structure 12 shown in FIG. 12 is formed by sequentially laminating the plating seed layer 301, the copper plating layer 304, an adhesive layer 401, a dielectric layer 402, an adhesive layer 501, and a plating seed layer 502. The method for forming the capacitor structure 12 will be described using FIGS. 14 to 20.

Figure 14:
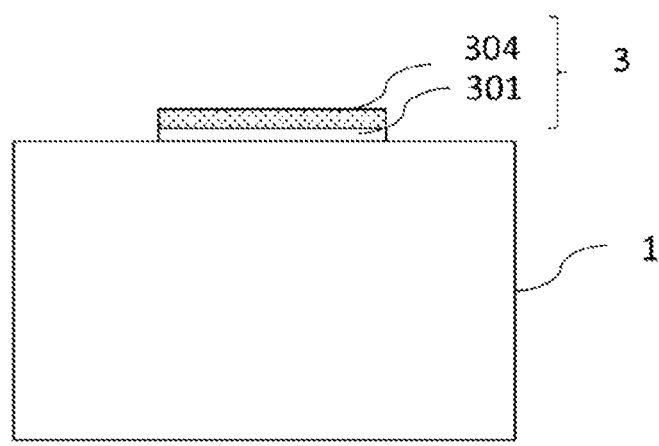
FIG. 14 is a cross-sectional view showing a step of forming a capacitor structure 12 on a core substrate 1 according to an embodiment of the present invention.

The method for forming a thin film conductor, which is the plating seed layer 301 of FIG. 14, may include, for example, vacuum deposition, sputtering, ion plating, a molecular beam epitaxy (MBE) method, a laser ablation method, a CVD method, and the like, and a typical method may be used. The plating seed layer 301 is used as a power supply layer for forming the copper plating layer 304 by the semi-additive process. The plating seed layer 301 may be formed of, for example, copper, nickel, titanium, aluminum, chromium, molybdenum, tungsten, tantalum, gold, palladium, iridium, ruthenium, platinum, or a combination thereof. More preferably, copper is desirable to facilitate the etching removal later.

The plating seed layer 301 of FIG. 14 desirably has a thickness of 10 nm or more and 5 µm or less. A plating seed layer having a thickness of less than 10 nm may undesirably lead to a conduction failure in the subsequent copper electroplating step. When the thickness is 5 µm or more, it takes an excessive amount of time to etch the target section to be removed in the patterning. More preferably, 100 nm or more and 500 nm or less is desirable.

Figure 15:
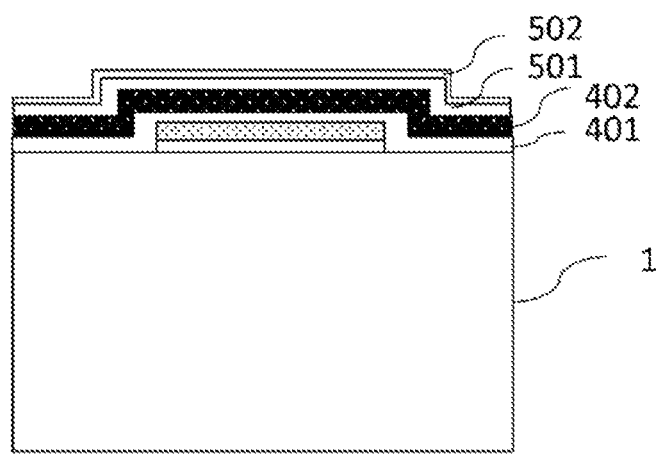
FIG. 15 is a cross-sectional view showing a step of forming the capacitor structure 12 on the core substrate 1 according to the embodiment of the present invention.

In FIG. 15, titanium is sputtered to form the adhesive layer 401 on a lower electrode formed by the copper plating layer 304. The adhesive layer 401 is provided to increase the reliability of the MIM capacitor by improving the adhesion between the metal and the dielectric layer. Therefore, the adhesive layer 401 does not necessarily have to be formed if sufficient adhesion is achieved. The adhesive layer 501 is also formed as required for the purpose of playing the same role. Further, as the dielectric layer 402 of the MIM capacitor of FIG. 15, a thin film layer of silicon nitride is formed. In view of the insulation properties and the relative permittivity, the dielectric layer 402 may be selected from alumina, silica, silicon nitride, tantalum oxide, titanium oxide, calcium titanate, barium titanate, and strontium titanate.

The thickness of the dielectric layer 402 is desirably 10 nm or more and 1 µm or less. It is difficult for a dielectric layer 402 with a thickness of 10 nm or less to maintain the insulation properties and such a dielectric layer may fail to function as the capacitor. To obtain the dielectric layer 402 with a thickness of 1 µm or more, an excessive amount of time is required for the thin film formation. Thus, the thickness of the dielectric is more preferably 50 nm or more and 500 nm or less.

Next, the plating seed layer 502 is formed on the adhesive layer 501 as a power supply layer for forming an intermediate conductive layer 503 by the semi-additive process. The plating seed layer 502 may be formed of, for example, copper, nickel, aluminum, titanium, chromium, molybdenum, tungsten, tantalum, gold, iridium, ruthenium, palladium, platinum, or a combination thereof. Copper is more preferred to facilitate etching removal later. The thickness of the plating seed layer 502 is desirably 10 nm or more and 5 µm or less. A plating seed layer having a thickness of less than 10 nm may undesirably lead to a conduction failure in the subsequent copper electroplating step. When the thickness is 5 µm or more, it takes an excessive amount of time to etch the section to be removed in the patterning. More preferably, 100 nm or more and 500 nm or less is desirable.

Figure 16:
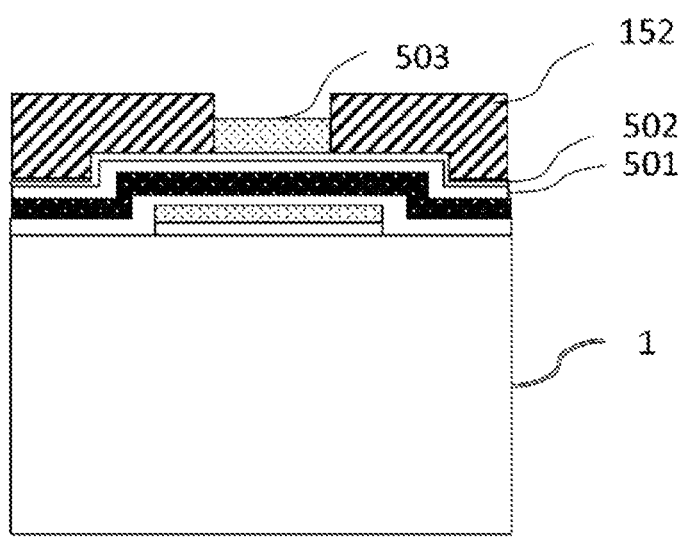
FIG. 16 is a cross-sectional view showing a step of forming the capacitor structure 12 on the core substrate 1 according to the embodiment of the present invention.

Subsequently, a resist pattern 152 is formed in FIG. 16. Electroplating is performed at the opening portion of the resist using the plating seed layer 502. Examples of the electroplating include nickel electroplating, copper electroplating, chromium electroplating, palladium electroplating, and gold electroplating. Material that requires simple steps, low cost, and has good electrical properties is preferred. The intermediate conductive layer 503, which is the upper electrode of the capacitor, is constituted by a copper plating layer. In terms of the forming method, the copper electroplating is desirable because of ease, low cost, and high electrical conductivity. Nickel, chromium, palladium, gold, or iridium may be used in addition to copper.

Figure 17:
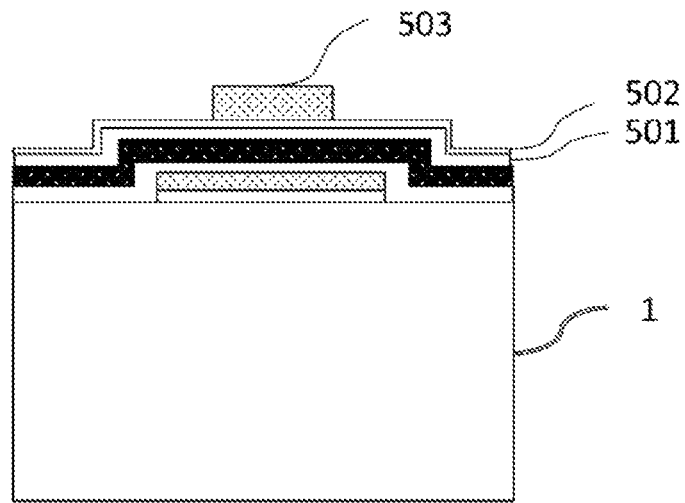
FIG. 17 is a cross-sectional view showing a step of forming the capacitor structure 12 on the core substrate 1 according to the embodiment of the present invention.

In FIG. 17, unnecessary resist 152 is removed, so that the upper electrode, which is formed by the intermediate conductive layer 503, and the plating seed layer 502 are exposed on the substrate. For removal of the resist 152, a chemical method using an alkaline solution, dry etching, or the like may be used, but the removal method is not limited.

Figure 18:
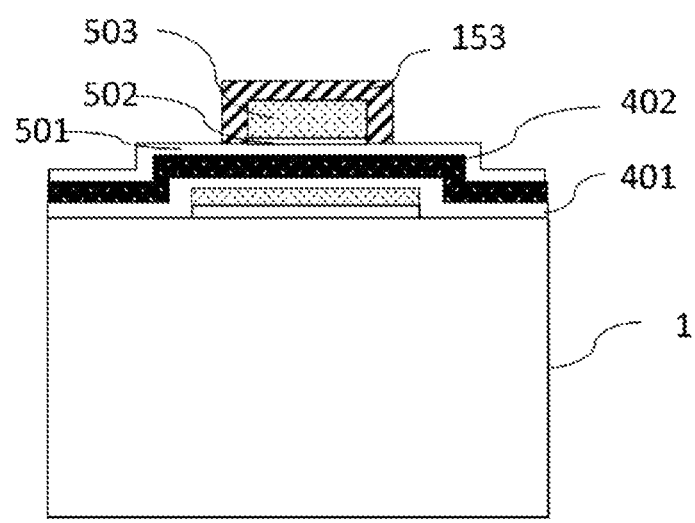
FIG. 18 is a cross-sectional view showing a step of forming the capacitor structure 12 on the core substrate 1 according to the embodiment of the present invention.
Figure 19:
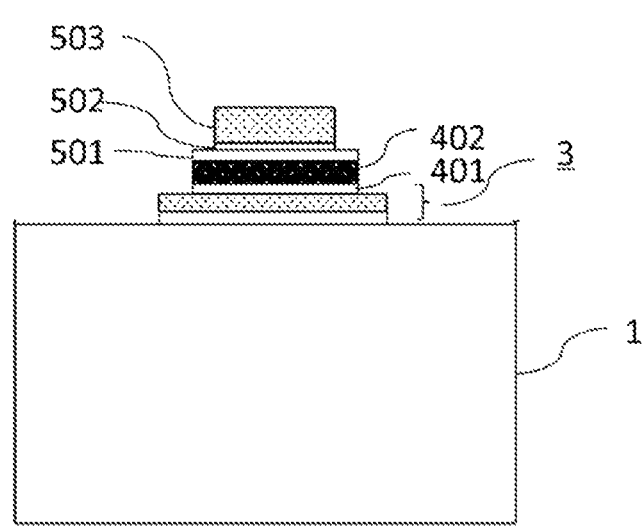
FIG. 19 is a cross-sectional view showing a step of forming the capacitor structure 12 on the core substrate 1 according to the embodiment of the present invention.

Next, in FIG. 18, a photoresist 153 is used to cover the plating seed layer 502 that has been patterned and the copper plating layer 503. Subsequently, as shown in FIG. 19, leaving the portion covered with the photoresist 153, other unnecessary portions of the adhesive layer 501, the dielectric layer 402, and the adhesive layer 401, which are laminated on the front layer of the core substrate 1, are removed. The removal method may be dry etching or the like in addition to a chemical method but is not limited.

In the state shown in FIG. 19, since the dielectric layer 402 is thin, short circuits easily occur between the ends of the lower electrode adhesive layer 401 and the upper electrode adhesive layer 501. Thus, the edges of the adhesive layer 501 may be partially removed as required to prevent short circuits between the adhesive layer 501 and the adhesive layer 401.

Figure 20:
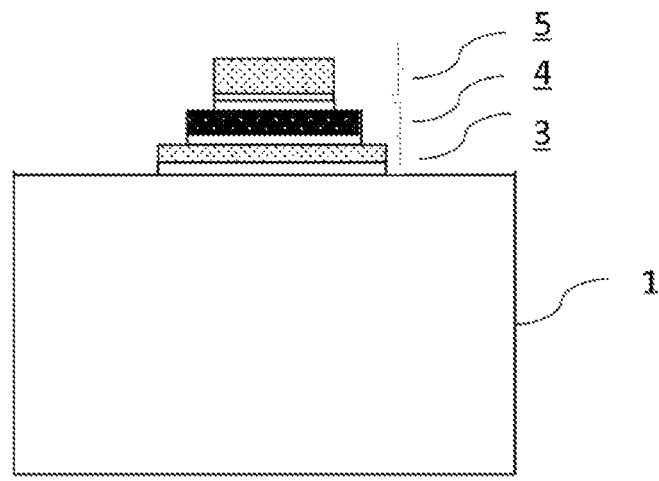
FIG. 20 is a cross-sectional view showing a step of forming the capacitor structure 12 on the core substrate 1 according to the embodiment of the present invention.

The capacitor structure 12 shown in FIG. 20 is obtained through the above steps. The lower electrode, dielectric, and upper electrode of the capacitor structure 12 formed in the present embodiment are shaped by plating and etching using the resist pattern. Note that the electrode shape and the dielectric shape may be any shape as long as the electrode area of the conductor and the dielectric volume calculated for obtaining the desired capacitance value are obtained. The shape of the electrode in the present embodiment is circular, but may be polygonal or any shape.

Figure 21:
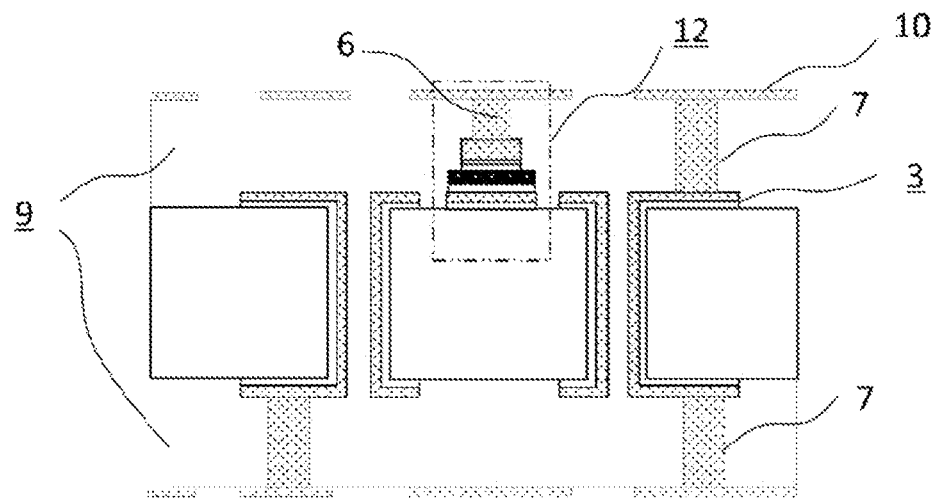
FIG. 21 is a cross-sectional view showing a step of forming a multilayer circuit board according to an embodiment of the present invention.

In forming the multilayer circuit board 15 of FIG. 21, the conductive layers and the insulating resin layers 9 are alternately laminated. The insulating resin may be made of epoxy resins, polyimides, maleimides, polyethylene terephthalate, polyphenylene oxides, liquid crystal polymers, and a composite material thereof, and photosensitive polyimide resins, photosensitive polybenzoxazole, and photosensitive acrylic-epoxy resins. The method for forming the insulating resin layers 9 is not limited. For a sheet-like material, a vacuum lamination method, vacuum pressing, or a roll lamination method may be used.

When the insulating resin layers 9 are made of liquid material, the forming method may be selected from slit coating, curtain coating, die coating, spray coating electrostatic coating, inkjet coating, gravure coating, screen printing, gravure offset printing, spin coating, and doctor coating. Additionally, when forming an outermost layer, a solder resist may be used.

In forming the interlayer vias 7 to be formed in the insulating resin layers 9 of FIG. 22, when a non-photosensitive resin is used, the via holes can be formed by laser processing. The same process can be used to form the opening of the upper electrode via 6 of the capacitor and the connecting via 8. Examples of the laser include a CO2 laser, a UV laser, a picosecond laser, and a femtosecond laser. When the insulating resin is formed of a photosensitive material, the via holes can be formed using photolithography. The method is not limited as long as openings are formed in the insulating resin uniformly, and the via holes are formed that electrically connect the conductive layer of the lower layer to the conductive layer of the upper layer.

After forming the openings, desmearing is performed using a permanganate solution as appropriate, so that the resin surface is roughened and the inside of the via holes is cleaned. This improves the adhesion at the boundary surfaces of the copper plating layer and the insulating resin layer. For adhesion and washing of the inside of the holes, plasma treatment may be used.

The interlayer vias 7 and the connecting via 8 are interlayer connecting portions that electrically connect the wiring formed on the lower conductive layer 3 to the upper conductive layer 10. The connecting via 8 is connected to the wiring pattern on the lower conductive layer 3 that includes one end of the inductor, which constitutes the LC resonant circuit, and the capacitor lower electrode, which constitutes the LC resonant circuit.

The insulating resin layer 9, the via holes, the plating layers may be formed by repeating known techniques to form the multilayer circuit board 15.

In a step of forming the wiring pattern by laminating the lower conductive layer 3 on the core substrate 1, the inductor structure 13 is formed that constitutes the LC resonant circuit according to the embodiment of the present invention. The inductor is obtained by alternately connecting the upper and lower layers of the core substrate 1 in series with the wiring pattern including the through holes 2 in the core substrate 1 and the lower conductive layers 3 formed on the front and rear of the core substrate 1. The wiring pattern may be formed into a planar spiral inductor. A three-dimensional solenoid or a spiral inductor may be formed in the insulating resin layer using the interlayer vias 7. Any structure may be employed as long as it has the inductance value. When the inductor and the capacitor constitute the LC resonant circuit, one end of the connection wiring of the inductor is located on the wiring pattern on the lower conductive layer 3 and is electrically connected to the capacitor by the wiring pattern on the lower conductive layer 3.

Although the inductance value of the inductance structure 13 depends on the number of turns, the cross-section, and the inductance length, the inductance value of the solenoid coil can be controlled by using a magnetic material for the core.

To achieve the desired capacitance value with the capacitor structure 12, two capacitor structures 12 may be connected in series or in parallel. For such connection, the wiring pattern formed on the lower conductive layer 3 or the wiring pattern formed on the upper conductive layer 10 is used. When the inductor and the capacitor constitute the LC resonant circuit, the lower electrode of the capacitor formed on the lower conductive layer 3 is electrically connected to one end of the inductor formed on the lower conductive layer 3 with the wiring pattern formed on the lower conductive layer 3.

The interlayer vias 7 and the connecting via 8 according to the embodiment of the present invention are formed by opening via holes in the insulating resin layer 9 from the upper layer by a laser or the like. The energization process is performed by via-filling plating.

To have the high-frequency current to remain in a resonant condition in a path closest to the LC resonant circuit, in the present embodiment, the connecting via 8 is located on an arc outside a circle the diameter of which extends from one end of the inductor to one end of the capacitor. In the present embodiment, the connecting via 8 is arranged on a circle having a diameter of 400 μm. The opening diameter of the upper electrode via 6 is 35 μm in the present embodiment. The opening diameter is smaller than the lower electrode or the upper electrode to which the via is connected, and is preferably 15 μm or more and 50 μm or less.

In the present embodiment, the wiring pattern on the upper conductive layer 10 connected to the parallel resonant circuit through the connecting via 8 is directly connected to the input/output terminal. In the case in which a filter is constituted using a plurality of resonant circuits as in FIG. 23, the connecting portions that connect the resonant circuits with the wiring pattern may be increased. In the case in which a filter is constituted using a resonant circuit on a main line as in FIG. 24, the connecting portions that connect the resonant circuit with the wiring pattern may be used. In some cases, the parallel resonant circuit and series resonant circuit are connected to the GND for high frequencies. In this case, the connecting via 8 may be used for connection.

As described above, in the embodiment of the present invention, the LC resonant circuit and the main line are separated via the connecting via 8 at the section where the element end portion of the LC resonant circuit are connected, thereby creating points where the potentials coincide with each other and separating the paths of the high-frequency current. Furthermore, also in the structure in which a plurality of LC resonant circuits are located in the circuit, the connecting vias 8 are used to separate the individual current path.

Thus, an advantageous effect of improving the frequency selection characteristics is achieved, and a filter having high-frequency selectivity can be formed in the multilayer circuit board.

The connecting via 8 can be simultaneously formed in the step of forming the upper electrode via 6 and the interlayer vias 7. The wiring that connects the connecting via 8 to the input/output terminals 601 to 604 can also be formed simultaneously in the step of forming the wiring on the upper conductive layer 10. This eliminates the need for adding a new step.

EXAMPLES

Example 1

FIGS. 25-a and 25-b are top views of the simplest LC parallel resonant circuit constituted by the multilayer circuit board. The capacitor structure 12 and the inductor structure 13 are shown as identical and the dimensions of the elements are also the same. The circuit is designed so that the resonant frequency is approximately 5 GHz. The series resonant frequency and the parallel resonant frequency of the coil (L) and the capacitor (C) are obtained by the following formula.

$$F=1/(2\pi\sqrt{(LC)})$$

To obtain the resonant frequency of approximately 5 GHz, the capacitor structure of approximately 1 pF and the inductance of approximately 1 nH are three-dimensionally arranged.

FIG. 25-a is a circuit including the connecting via 8 of the present invention. The wiring of the lower electrode layer is drawn out from the upper conductive layer 10 to the input/output terminal through the connecting via 8. FIG. 25-b is a circuit in which the wiring of a lower wiring layer is drawn out to the input/output terminal directly. The wiring is covered with the insulating resin layer 9 between the layers in either case.

The cross-sections of FIGS. 25-a and 25-b correspond to those of FIGS. 2 and 4. As the core substrate 1, EN-A1 (with a thickness of 300 µm) manufactured by AGC Inc. was used. A piece of glass having a thickness of 300 µm was prepared, and the through holes 2 were formed using a laser. The through holes 2 were designed in a cylinder form with a diameter of 80 µm.

As the plating seed layer 301 for forming the lower conductive layer 3, titanium and copper were formed by sputter deposition, followed by electroless nickel plating. The thicknesses of the titanium, copper, and nickel were 50 nm, 300 nm, and 80 nm.

Subsequently, the photosensitive dry film resist was adhered by roll lamination, and the resist pattern was formed by photolithography. Patterning of the lower conductive layer 3 having a width of 7 µm was performed by copper plating, and the resist pattern was removed in an alkaline solution. Furthermore, nickel, copper, and titanium layers of the plating seed layer were removed using an etching mixture of nitric acid and hydrogen peroxide. Nickel and copper were removed using an etching mixture of sulfuric acid and hydrogen peroxide, and titanium layers were removed using an etching solution of potassium hydroxide and hydrogen peroxide to thereby obtain the desired inductance structure. The wiring width used for the inductance structure 13 was set to 110 µm. The pitch of the through holes 2 was set to 385 µm in the radial direction of the inductor and 145 µm in the longitudinal direction to form the inductance of 1.5 turns. The width of the wiring formed on the lower conductive layer may be 110 µm or more depending on the electrode dimension.

Further, silicon nitride was formed with a thickness of 200 nm as the dielectric on the upper layer of the lower conductive layer to form the capacitor structure 12. In the present example, titanium was not provided as the adhesive layer on the lower electrode. The upper electrode of the capacitor had a circular shape with a diameter of 111 µm, and two capacitors were series-connected through the wiring pattern having a width of 110 µm formed on the upper conductive layer 10 and the upper electrode via 6. After forming 50 nm of titanium by sputtering as the adhesive layer 501 of the intermediate conductive layer 5, the intermediate conductive layer 5 of 2 µm was formed by copper electroplating, which served as the upper electrode of the MIM capacitor.

A build-up resin GX-T31 (manufactured by Ajinomoto Fine-Techno Co., Inc.) was used for the insulating resin layer 9. The diameter of the interlayer via hole was set to 35 After desmearing and electroless copper plating, a dry film resist with a thickness of 25 µm was formed on the front and rear of the substrate.

After forming the capacitor structure 12, the insulating resin layer 9 was formed and then the via holes were formed by a UV laser processing machine. After that, the connecting via 8, the interlayer vias 7, and the upper electrode via 6 were subjected to copper plating to provide electrical conduction.

After forming the resist pattern by photolithography, a conductive layer having a thickness of 7 µm was formed by copper electroplating on the plating seed layer. The wiring width was set to 110 µM, and was partially enlarged to match the size of the electrode. The structure of the multilayer circuit board 15 can be obtained by repeating the above steps.

(LC Parallel Resonant Circuit)

The results of a three-dimensional electromagnetic analysis performed using the above structure by simulation is shown. The electromagnetic analysis software HFSS manufactured by ANSYS, Inc. was used. As the evaluation method, the graph in FIG. 26 shows the transmission characteristics at the resonant frequency. The transmission characteristics from the input/output terminal 601 to the input/output terminal 602 in FIG. 25 are indicated as "Connecting via with diameter of φ35 µm". The transmission characteristics from the input/output terminal 603 to the input/output terminal 604 in FIG. 25 are indicated as "No connection". As a result, in the models including and not including the connecting via 8, the frequency difference in the resonant frequency is 10 MHz or less. The model with the connecting via 8 achieves higher impedance at the resonant frequency and achieves a higher attenuation amount without variation in the resonant frequency compared with the structure without the connecting via 8.

Although embodiments of the present invention have been described above, the present invention is not limited to the above-described embodiments, and various modifications may be made without departing from the scope of the present invention.

REFERENCE SIGNS LIST

1 . . . Core substrate; 2 . . . Through hole; 3 . . . Lower conductive layer; 4 . . . Dielectric layer; 5 . . . Intermediate conductive layer; 6 . . . Upper electrode via (of capacitor); 7 . . . Interlayer via; 8 . . . Connecting via; 9 . . . Insulating resin layer; 10 . . . Upper conductive layer; 101 . . . Upper conductive layer GND; 12 . . . Capacitor structure; 121 . . . Capacitor unit; 13 . . . Inductor structure; 14 . . . Resonant circuit connecting portion; 15 . . . Multilayer circuit board; 151 . . . Resist; 152 . . . Resist; 153 . . . Resist; 301 . . . Front plating seed layer (lower conductive layer 3); 302 . . . Rear plating seed layer (lower conductive layer 3); 303 . . . Plating seed layer in through hole; 304 . . . Copper plating layer (lower conductive layer 3); 401 . . . Lower electrode adhesive layer (such as titanium); 402 . . . Dielectric layer (such as alumina and silicon nitride); 501 . . . Upper electrode adhesive layer; 502 . . . Plating seed layer; 503 . . . Thick film layer of intermediate conductive layer; 601 . . . Input/output terminal; 602 . . . Input/output terminal; 603 . . . Input/output terminal; 604 . . . Input/output terminal; 901 . . . Insulating resin layer; 902 . . . Insulating resin layer; 903 . . . Insulating resin layer.

What is claimed is:

1. A multilayer circuit board comprising:
   a core substrate;
   a lower conductive layer on an upper surface of the core substrate;
   an insulating resin layer on the lower conductive layer opposite to the core substrate;
   an upper conductive layer on the insulating layer opposite of the lower conductive layer;
   a capacitor on the upper surface of the core substrate, the capacitor extends into the insulating resin layer;
   an inductor in the core substrate; and
   a connecting via;
   wherein the lower conductive layer comprises a first set of wiring lines;
   the upper conductive layer comprises a second set of wiring lines;
   the first set of wiring lines connects the capacitor and the inductor to form an LC resonant circuit;
   the via extends through the insulating resin layer to electrically connect the first set of wiring lines with the second set of wiring lines, without extending through the core substrate.

2. The multilayer circuit board of claim 1, wherein the capacitor is a laminate of a lower electrode, a dielectric layer, and an upper electrode, the lower electrode being on the lower conductive layer directly laminated on the core substrate.

3. The multilayer circuit board of claim 1, further comprising a third conductive layer laminated directly of a lower surface of the core substrate, the lower surface is opposite to the upper surface;
   the lower conductive layer is laminated on the upper surface of the core substrate;
   wherein
      the inductor is a solenoid inductor comprising
      a plurality of wiring lines formed on the third conductive layer and the lower conductive layer; and
      a plurality of through holes each extending through the core substrate between the lower surface and the upper surface and each having a wall having a through hole conductive layer, wherein
      the plurality of wiring lines and the plurality of through holes are connected in series.

4. The multilayer circuit board of claim 1, wherein the inductor comprises a planar coil.

5. The multilayer circuit board of claim 1, wherein the inductor connected a plurality of planar coils connected in series.

6. The multilayer circuit board of claim 1, wherein the LC resonant circuit comprises an LC parallel resonant circuit, and
   the first set of wiring lines connect both ends of the inductor constituting the LC parallel resonant circuit to both ends of the capacitor constituting the LC parallel resonant circuit.

7. The multilayer circuit board of claim 1, wherein the LC resonant circuit comprises an LC series resonant circuit,
   the first set of wiring lines include
   a wiring line that is connected to an end of the inductor constituting the LC series resonant circuit other than an end connected to the capacitor constituting the LC series resonant circuit, and
   a wiring line that is connected to an end of the capacitor constituting the LC series resonant circuit other than an end connected to the inductor constituting the LC series resonant circuit.

8. The multilayer circuit board of claim 1, wherein the LC resonant circuit comprises a combination of an LC parallel resonant circuit and an LC series resonant circuit.

9. An electronic component package comprises the multilayer circuit board of claim 1, wherein
   the multilayer circuit board further comprises at least one of a passive component or an active component, which are mounted on or embedded in the multilayer circuit board.

* * * * *